(12) United States Patent
Bertz et al.

(10) Patent No.: US 6,969,628 B2
(45) Date of Patent: Nov. 29, 2005

(54) MICROSTRUCTURE AND METHOD FOR THE PRODUCTION THEREOF

(75) Inventors: Andreas Bertz, Chemnitz/Klaffenbach (DE); Thomas Gessner, Chemnitz (DE); Matthias Küchler, Chemnitz (DE); Roman Knöfler, Gersdorf (DE)

(73) Assignee: memsfab GmbH, Chemnitz (DE)

( * ) Notice: Subject to any disclaimer, the term of this patent is extended or adjusted under 35 U.S.C. 154(b) by 71 days.

(21) Appl. No.: 10/296,771

(22) PCT Filed: Jun. 13, 2001

(86) PCT No.: PCT/DE01/02237

§ 371 (c)(1),
(2), (4) Date: Dec. 13, 2002

(87) PCT Pub. No.: WO01/96232

PCT Pub. Date: Dec. 20, 2001

(65) Prior Publication Data

US 2003/0176007 A1    Sep. 18, 2003

(30) Foreign Application Priority Data

Jun. 13, 2000    (DE) ................................ 100 29 012

(51) Int. Cl.⁷ ............................................. H01L 21/00
(52) U.S. Cl. ......................................... 438/48; 438/52
(58) Field of Search .................................. 439/48–54

(56) References Cited

U.S. PATENT DOCUMENTS

| 4,580,439 A | 4/1986 | Manaka |
| 5,129,983 A | 7/1992 | Greiff |

(Continued)

FOREIGN PATENT DOCUMENTS

| DE | 195 40 120 | 5/1996 |
| DE | 199 28 291 | 12/1999 |

(Continued)

OTHER PUBLICATIONS

Petersen K E (1977) "Micromechanical Light Deflector Array" *IBM Technical Disclosure Bulletin*, vol. 20, No. 1, pp. 355-356.

(Continued)

*Primary Examiner*—H. Jey Tsai
(74) *Attorney, Agent, or Firm*—Collard & Roe, P.C.

(57) ABSTRACT

The invention relates to a microstructure in a preferably electrically conductive substrate (1), more specifically made of doped single crystal silicon, with at least one functional unit (2.1, 2.2) and to a method of fabricating the same. In accordance with the invention, the functional unit (2.1, 2.2) is mechanically and electrically separated from the substrate (1) on all sides by means of isolation gaps (5, 5a) and is connected, on at least one site, to a first structure (4a) of an electrically conductive layer (S) that is electrically isolated from the substrate (1) by way of an isolation layer (3) and that secures the unit into position relative to the substrate (1). For this purpose, the functional unit (2.1, 2.2) is released from the substrate (1) in such a manner that the isolation gaps (5, 5a) are provided on all sides relative to the substrate (1). The electrically conductive layer (S) is applied in such a manner that it is connected through contact fingers (4a) for example to the functional unit (2.1, 2.2) which it secures into position. The method in accordance with the invention permits to substantially facilitate the manufacturing process and to produce a microstructure with but small parasitic capacitances.

16 Claims, 5 Drawing Sheets

U.S. PATENT DOCUMENTS

Figure 1:
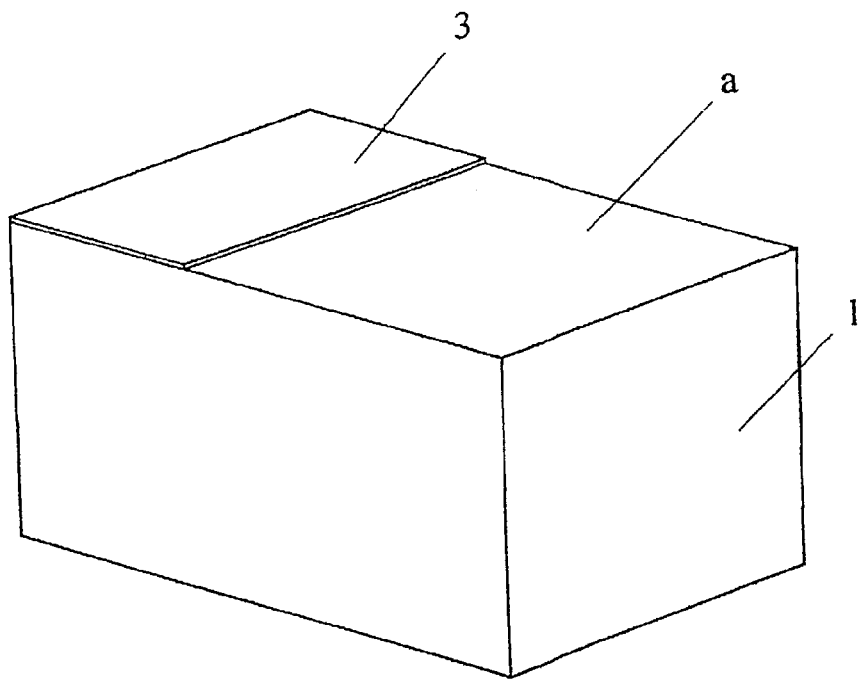

| | | | |
|---|---|---|---|
| 5,846,849 A | 12/1998 | Shaw et al. | |
| 5,930,595 A | 7/1999 | Sridhar et al. | |
| 6,199,874 B1 * | 3/2001 | Galvin et al. | 280/514 |
| 6,201,629 B1 * | 3/2001 | McClelland et al. | 359/223 |

FOREIGN PATENT DOCUMENTS

| | | |
|---|---|---|
| EP | 0 747 686 | 12/1996 |
| WO | WO91 03074 | 3/1991 |
| WO | WO95 10770 | 4/1995 |
| WO | WO 99 36 941 A2 | 7/1999 |

OTHER PUBLICATIONS

Sridhar, et al "Single Crystal Silicon Microstructures Using Trench Isolation" Institute of Microelectronics, pp. 258-261.

Petersen K E (*1977*) "Micromechanical Light Deflector Array" *IBM Technical Disclosure Bulletin*, vol. 20, No. 1, pp. 355-356.

Sridhar, et al "Single Crystal Silicon Microstructures Using Trench Isolation" *Institute of Microelectronics*, pp. 258-261.

* cited by examiner

MICROSTRUCTURE AND METHOD FOR THE PRODUCTION THEREOF

CROSS REFERENCE TO RELATED APPLICATIONS

Applicants claim priority under 35 U.S.C. §119 of German Application No. 100 29 012.4 filed Jun. 13, 2000. Applicants also claim priority under 35 U.S.C. §365 of PCT/DE01/02237 filed Jun. 13, 2001. The international application under PCT article 21 (2) was not published in English.

The invention relates to a microstructure and to a method of fabricating the same according to the preambles of claim 1 and 16.

On the basis of silicon wafers, which are widely used in the semiconductor technology, microstructures are very well suited to be manufactured and utilized as miniaturized sensors and actuators as well. For mechanical applications, it is thereby generally necessary to manufacture mechanically movable parts that are connected to a substrate by way of defined spring parts and fastening anchors. The mechanically movable parts are thereby to be fastened as rigidly and reliably as practicable, whereas the spring parts allow for a given mobility of the microstructures. In the past, the chiefly used technologies for manufacturing such microstructures make use of the silicon wafer over the entire thickness of the wafer. This technology, which is termed bulk micro-machining, is generally characterized by the use of at least 3 wafers and of anisotropic wet etching processes. To achieve further miniaturization and a reduction of cost, such technologies are presently increasingly gaining acceptance which only use the surface near region, or the surface region, of the silicon wafer. This latter technology is based on the deposition of additional layers, one of them subsequently serving as a functional layer for the micromechanical components whereas another layer is used as a so-called sacrificial layer only, which exposes the micromechanical components in the functional layer after its removal by etching. Although this technology has already been adopted in production, with partial success, the mechanical properties of the functional layers in particular are not so advantageous as those of single crystal silicon for many applications. With regard to the spring parts in particular, the major properties to be cited are that they be almost fatigue-free, that there is no tension on the layer and that they be very resistant to fracture. For this reason, the functional layer is partly replaced by single crystal silicon of a second wafer that has been previously bonded to the carrier wafer through an insulator layer using a wafer bonding technique. For such a composite wafer, termed an SOI-wafer, very high requirements are placed on the bonding technique and on the polishing of the second wafer to reach a small residual thickness thereof. Alternative solutions have therefore been developed to release the micromechanical components from the surface near region of a silicon wafer so that they also consist of single crystal silicon, at least in their core. This is described in WO 91/03074 for example in which structures may be exposed near the surface by means of a sequence of anisotropic and isotropic etching steps in combination with a passivation layer. This document however indicates no solutions as to the realization of the electrical contacts, the isolation against the substrate or other structures nor as to the mechanical fixation. By contrast, U.S. Pat. No. 5,846,849 suggests the metal-plating of both the surface and the lateral areas of the bare structures, which, at these locations, are provided with an isolation layer. The conduction of the electric potential for triggering the microstructure or the detection of a change in potential of an electrical measurement signal, as a result of a mechanical movement for example, may be carried out through this metal layer. The potential separation is thereby obtained by isolation trenches provided around all of the elements of this structure, bonding pads included. This relatively simple, and thereby inexpensive process sequence has two major disadvantages for the applicability of the micromechanical components manufactured with this method. The isolation and metal layers additionally deposited onto the silicon occasion mechanical tensions on the layers which may cause the microstructures to warp in vertical or horizontal direction. In this connection, such structures are also indicated to be very prone to temperature variations (Sridhar, U. et al.: Single Crystal Silicon Microstructures using Trench Isolation. Proceedings of the Transducers 99, Sendai, Japan, pp. 258–261). Further, due to the large surface of the silicon structures, which is covered with metal through an isolation layer, the unwanted parasitic capacitance between metal and the silicon substrate is very high. This is particularly critical since the use of microstructures for applications as sensors and actuators is preferably bound to the use of alternating voltages in the kHz range.

U.S. Pat. No. 5,930,595 largely overcomes the drawbacks described herein above in that, in a first step, the fastening anchors are released at three sides and at the bottom of the silicon substrate. Next, the isolation spaces are filled with an isolation material, and finally, the sensor structures at the fourth, non isolated side of the fastening anchors, are defined and in turn released from the silicon substrate. Since the structures obtained in the silicon are very thin or perforated, very high requirements are placed on the accuracy in allocating the sensor structures to the exposed structures of the fastening anchors. Here, they must be removed twice, in a way similar to that described in WO 91/03074. The major disadvantage of this method therefore is that it implies very complicated technical measures and at the same time reduces the output. Furthermore, the isolation trenches are preferably filled, at least partially, by thermal oxidation, which hinders the integration of integrated electronic circuits.

Further known microstructures made of single crystal silicon are provided with conductive connections between the microstructure and the substrate, said connections being formed by bridges (DE 199 28 291) or by ribs (DE 195 40 120) In both cases, one part of the microstructure made of single crystal silicon remains connected to the substrate, thus forming a mechanical fixation of the microstructure and concurrently interrupting the isolation provided on all the sides thereof.

WO 99/36941 achieves electric isolation of the microstructures on all the sides thereof. But here, trenches filled with isolation material are provided underneath the conductive bridges, said trenches forming a mechanical fixation of the microstructure otherwise completely surrounded by isolation gaps.

It is the object of the invention to substantially simplify the method of fabricating the microstructures, to thereby minimize both the undesired parasitic capacitance of the microstructures and undesired deformations of the microstructures and to ensure secure fixation into position of the functional unit and of the fastening anchor respectively. The solution to this object is achieved by the features of claim 1 and 16. Advantageous developments are recited in the subordinate claims.

The microstructure consists of at least one functional unit mounted in a preferably electrically conductive substrate, more specifically made of doped single crystal silicon. In accordance with the invention, the functional unit is mechanically and electrically separated from the substrate on all sides by means of isolation gaps and is connected, on at least one site, to a structure of an electrically conductive layer through which it is secured in position relative to the substrate. At least one electrode may be configured on the functional unit. It is also possible to configure the functional unit to form a fastening anchor to which at least one mass part, acting as an electrode for example, is connected through at least one spring part.

In this case again, fastening anchor, spring part and mass part are separated from the substrate by isolation gaps. A first lateral isolation gap is thereby located between the substrate and the side areas of the functional unit or the side areas of the fastening anchor, spring part and mass part, a second isolation gap being located between the substrate and the base area of the functional element or of the fastening anchor, spring part and mass part respectively. Said isolation gaps around fastening anchor, spring part and mass part thereby merge into one another and are preferably filled with gas or evacuated. In the simplest case, the isolation gaps are filled with air.

On at least one location, the functional unit (or the fastening anchor respectively) is connected to a first structure of an electrically conductive layer (bonding), said structure extending beyond the first lateral isolation gap and fixating said functional unit in position relative to the substrate. The electrically conductive layer preferably used is a metal layer, more specifically an aluminium layer The first structure of the electrically conductive layer, which spans the first lateral isolation gap between the functional element isolated from the substrate and the second structure of the electrically conductive layer isolated from the substrate by the isolation layer, are configured to form a perforated or slotted pattern at least above the regions of the isolation gaps. Said pattern may for example be configured to form a plurality of very thin strips of a preferred thickness of less than 1 $\mu$m. For the purpose of spanning the isolation gaps, a layer stack consisting of at least one electrically conductive layer and of at least one isolation layer may be used instead of a simple electrically conductive layer (first structure).

The isolation layer arranged between substrate and electrically conductive layer preferably consists of an oxide or a nitride and may also be an oxide nitride layer The electrically conductive layer is preferably contacted by way of peripheral connections.

For the substrate, silicon with a specific electrical resistance of less than 0.1 $\Omega$cm is used.

The method of manufacturing the microstructure in a preferably electrically conductive substrate, more specifically made of a doped single crystal silicon, with at least one functional unit, is carried out by removing the functional unit from the substrate in such a manner that isolation gaps are provided on all sides and that an electrically conductive layer is deposited in such a manner that it is connected to the functional unit, securing it into position.

To remove the functional unit from the substrate, the following method steps are preferably performed:
producing on the substrate an isolation layer with openings by patterning those regions which define the functional unit and the future surrounding first lateral isolation gaps between the substrate and the functional unit,
depositing the electrically conductive layer onto the isolation layer and onto that region, which is not provided with an isolation layer and will form the functional unit, and, concurrently or subsequently
patterning the electrically conductive layer in such a manner that at one site at least, a first structure of the electrically conductive layer remains connected to the functional unit to be produced, said connection extending through the future first lateral isolation gap between substrate and functional unit, and configuring a second structure of the electrically conductive layer that is connected to the first structure and, if necessary, a conductive pattern on the substrate provided with the isolation layer,
completely electrically and mechanically separating the functional unit from the substrate by a sequence of etching processes in connection with at least one passivation step so as to form the isolation gaps, the connection to the functional unit created by the first structure of the electrically conductive layer being maintained at one site at least in the way of a bridge so that the functional unit is secured into position as a result thereof.

If the functional unit is configured to form a fastening anchor, a spring part and a mass part formed thereon are completely electrically and mechanically separated from the substrate concurrently with the release of the fastening anchor.

The vertical regions that are not to be removed during etching are to be provided with a passivation layer.

The isolation layer is produced by thermal oxidation of silicon or by chemical vapour phase deposition To completely electrically and mechanically separate functional unit or fastening anchor, spring part and mass part from the substrate except for the mechanical fixation of the functional unit or of the fastening anchor through the first structure of the electrically conductive layer, the following processes are carried out:
forming the first lateral isolation gaps, etching wells into the substrate using a photolithographically manufactured mask concurrently with the mask produced through the masking effect of the patterned surface layers,
depositing a passivation layer on vertical and horizontal areas of the first lateral isolation gaps,
etching the passivation layer for the purpose of removing it from at least the bottom of the first lateral isolation gaps, undercutting the substrate material under the microstructures protected both on the side areas and on the surface thereof in order to produce the second isolation gap between substrate and bottom of the functional unit or of fastening anchor, spring part and mass part.

The wells are etched into the substrate preferably normal to the substrate surface by means of reactive ion etching processes. Simultaneously or after the preferred vertical etching relative to the surface of the substrate, a defined isotropic etching of the substrate material is performed by means of reactive ion etching processes in the substrate to completely electrically isolate the substrate from the electrically conductive layer.

To etch the wells (for the purpose of forming the isolation gaps), gases containing fluorine and carbon or, as an alternative, gases containing chlorine or fluorine are utilized.

After isotropic etching, by means of dry etching processes or using wet chemical etch solutions, the passivation layer (e.g., a plasma polymer) is completely removed from the surface of the electrically conductive layer, e.g., by means of a dry etching process.

The electrically conductive layer is in most cases contacted by subsequently installing peripheral connections. The peripheral connections may also already be provided in the surrounding substrate, though.

The method in accordance with the invention permits to substantially simplify the manufacturing process and to produce a microstructure with but small parasitic capacitance. More specifically, the persistent use of self-adjusting principles permits to release the microstructures from the substrate material and, simultaneously, the fastening anchor. This means that several etching steps and at least one deposition process, for passivation, may be dispensed with, which at the same time corresponds to an output increase. Furthermore, the microstructures and the fastening anchors thereof are defined in the same lithography step. Therefore, there can be no mismatches between these, which enhances the function and the reliability of the microstructures. As the isolation between the fastening anchor and the substrate on the side faces and the bottom of the structure is substantially achieved by means of an air or vacuum gap, the capacitance undesirably acting therethrough is already reduced to a quarter as compared to a $SiO_2$ layer being used since the dielectric constant is smaller. Furthermore, the spacing between fastening anchor and substrate may be increased since it is no longer necessary to fill it with an isolation material, which, for economical reasons, is only practicable up to a gap width of a few micrometers. Oxidation for the purpose of isolating or electrically separating fastening anchor and substrate may generally be dispensed with. While metal-free, movable structures may thus be manufactured and utilized, it is also possible to remove the passivation layer without using wet processes. These may cause the structures to undesirably stick together, more specifically because of the action of capillary forces. Accordingly, an operational microstructure is proposed the functionality of which is not impaired by tensions on the layers.

The method in accordance with the invention may for example be used on a silicon wafer already provided with structures, on an integrated circuit for example, or on a bare silicon wafer In both cases, the silicon wafer is to be provided on the surface thereof with an isolator, if not yet provided. If necessary, contact openings without any isolation layer may be provided in the first mentioned case. Said isolation layer is to be removed, in accordance with the invention, at those locations at which, in the subsequent sequence of method steps, the microstructures are to be created together with their fastening anchors and the first lateral isolation gaps. This selective removal of the layer may be performed by means of actually known lithographic and etching processes. Next, an electrically conductive layer and its pattern are deposited. The electrically conductive layer may consist of a metal such as aluminium. During patterning, which again is performed on the basis of actually known lithographic and etching processes, the areas which will later serve as fastening anchors, are placed in electric contact by means of circuit traces. The other side of the circuit traces is conducted to the electric contact areas already provided on the wafer or is used to form external contact areas, so-called bonding pads for example. It is thereby to be noted that the circuit traces are perforated or configured to be very thin at those locations which will subsequently form the isolation trenches of the fastening anchors so that, later on, the least possible silicon needs to be removed by etching from under said traces. After these steps, silicon is etched to depths of e.g., 20 $\mu$m, passivation is performed by means of a passivation layer and, finally, the microstructures and the fastening anchors thereof are exposed. During etching, the metal layer in particular is not allowed to be substantially attacked, since otherwise the first regions (contact fingers) of this electrically conductive layer, which are not protected by a resist, may be damaged or stripped off. The openings obtained by etching the silicon and reaching deep into the functional unit thus form the first lateral isolation gaps and possibly also the side areas which are of importance in many cases of application as they act as capacitor electrodes, as well as the perforation of the microstructures with the fastening anchors which is necessary for efficient exposition. If a precisely focused etching process is utilized, the silicon remains under the contact fingers and must be removed subsequently from the side by means of isotropic etching. In the case of a first structure of the electrically conductive layer in the form of contact fingers with a width of e.g., 0.8 $\mu$m, the lateral removal must at least amount to 0.4 $\mu$m. The width of the microstructures is reduced as a result thereof, which may be taken into consideration by providing the microstructures with a reserve dimension. The component parts of the microstructure are thereby designed with at least 0.4 $\mu$m more width at each edge than the structure width is desired to be upon completion thereof. This also applies when the method used for etching silicon simultaneously performs deep etching and lateral etching by at least the desired amount. The only exception are those etching methods in which lateral ablation is only carried out under the regions that are not covered with the photoresist, meaning for example underneath the metallic contact fingers. In these cases, all of the microstructures that are not masked with photoresist need not be provided with an additional reserve dimension.

According to a particularly advantageous embodiment, the passivation layer is made of an organic polymer that contains both carbon and fluorine and is formed under the action of plasma. After the microstructures are exposed, said polymer layer may be removed preferably using plasma activated oxygen. As a result thereof, wet processes may be dispensed with on the one hand, on the other hand, the microstructures eventually only consist of mere silicon. Prior to applying the resist mask, it may further be advisable, for the purpose of etching silicon into the depth, to deposit an additional passivation layer which is also etched over said mask and which prevents the etchant from laterally attacking the external line of the contact area between the first structure of the electrically conductive layer (e.g., contact finger) and the upper side of the functional unit or the fastening anchor during the subsequent isotropic silicon etching.

Depending on the range of application of the microstructures, the silicon substrate should be sufficiently doped or be provided with this doping level during or after the here represented sequence of method steps. In many cases of application, $10^{17}$ dopant atoms for each $cm^3$ will suffice.

The invention will be described in greater detail herein after with reference to an embodiment thereof, given by way of example only, and to the appended drawings.

FIG. 1 shows substrate 1 with a patterned isolation layer 3 deposited thereon

Figure 2:
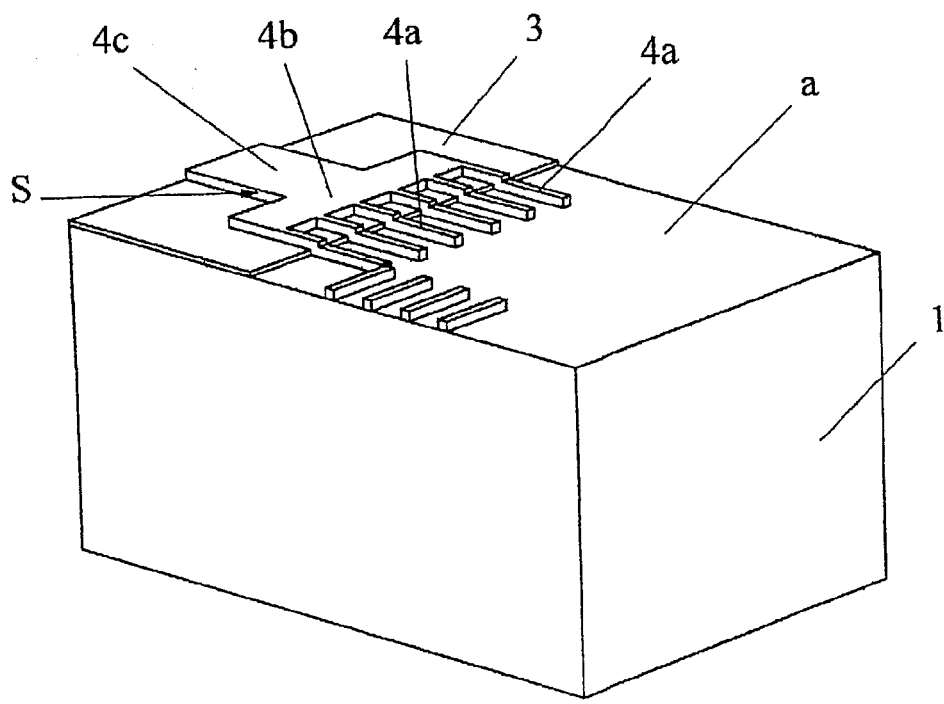
Figure 3:
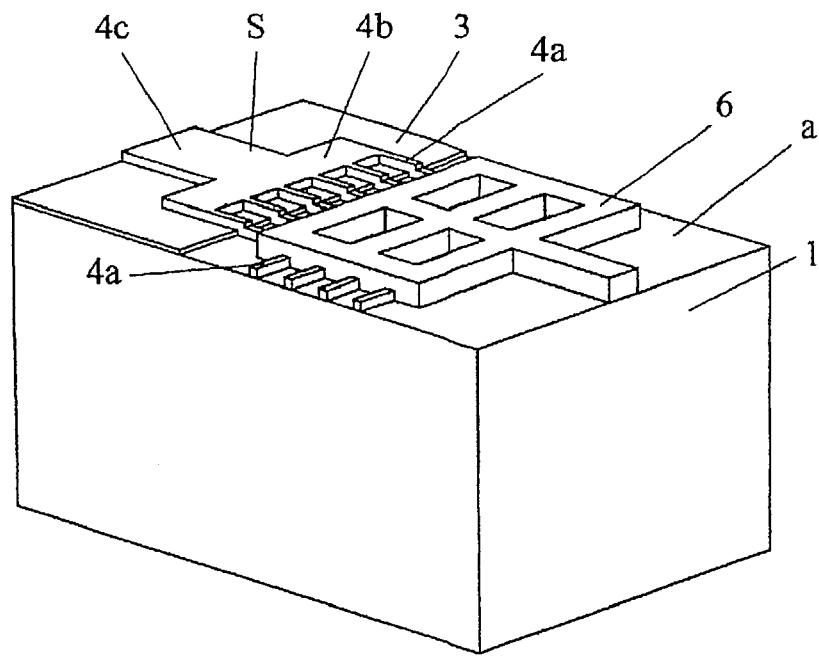
Figure 4:
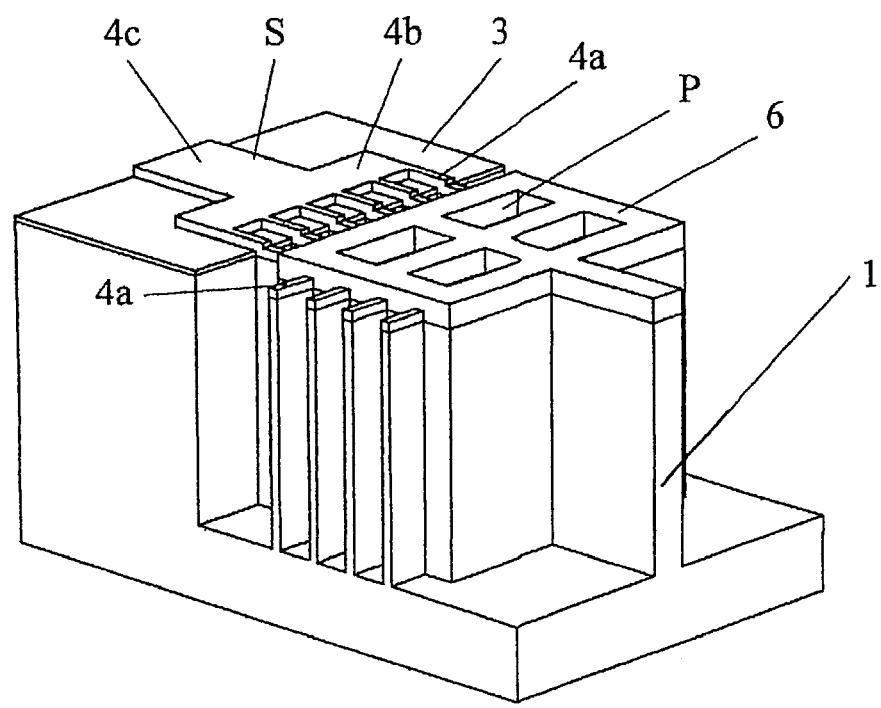
Figure 5:
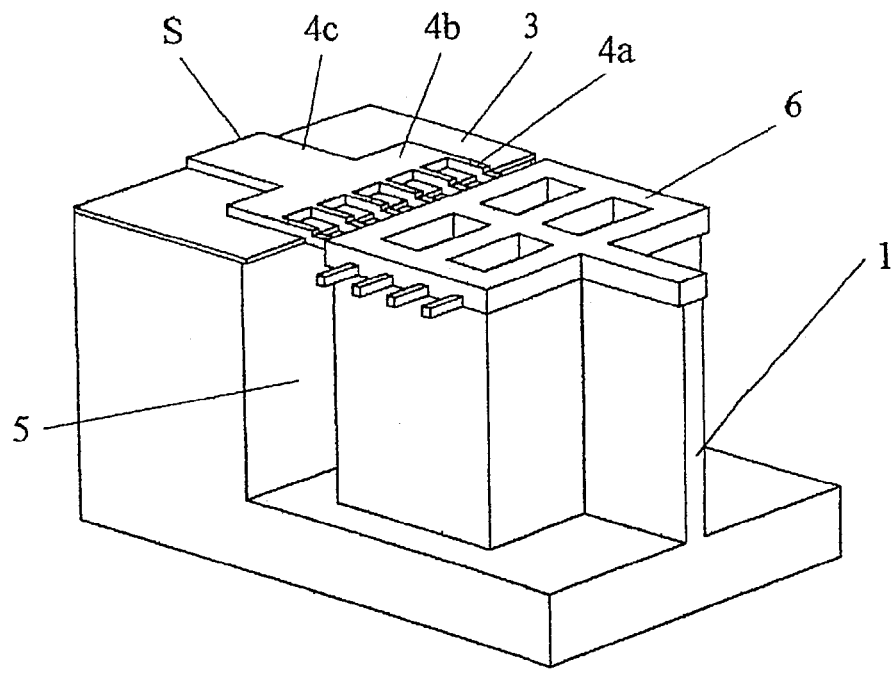
Figure 6:
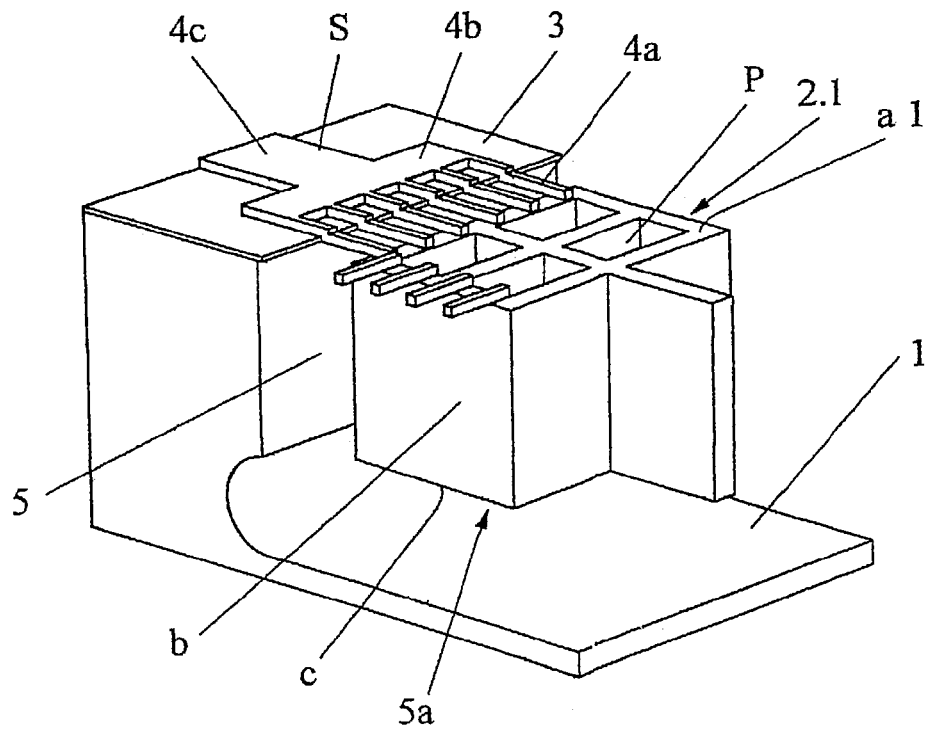
Figure 7:
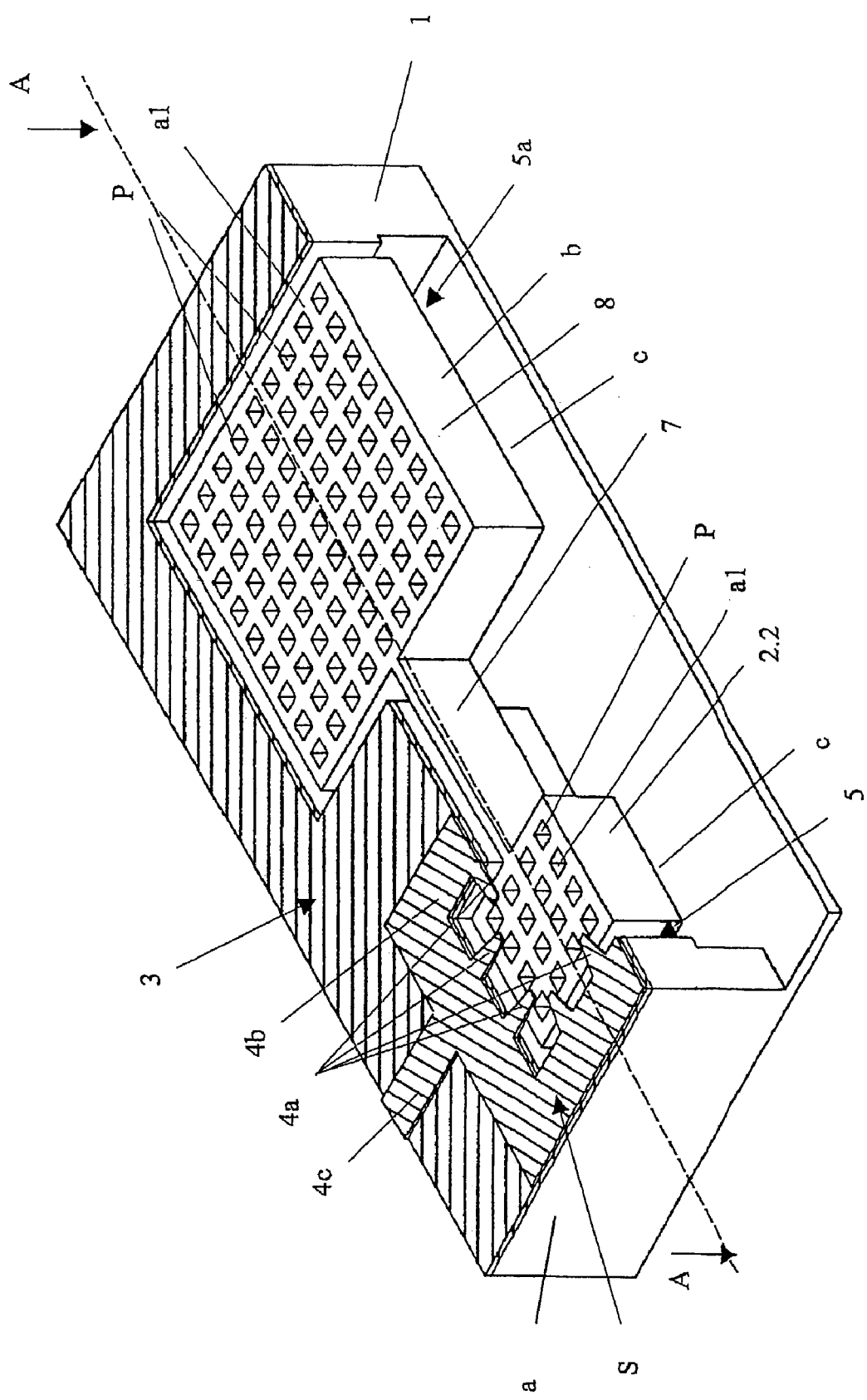
Figure 8:
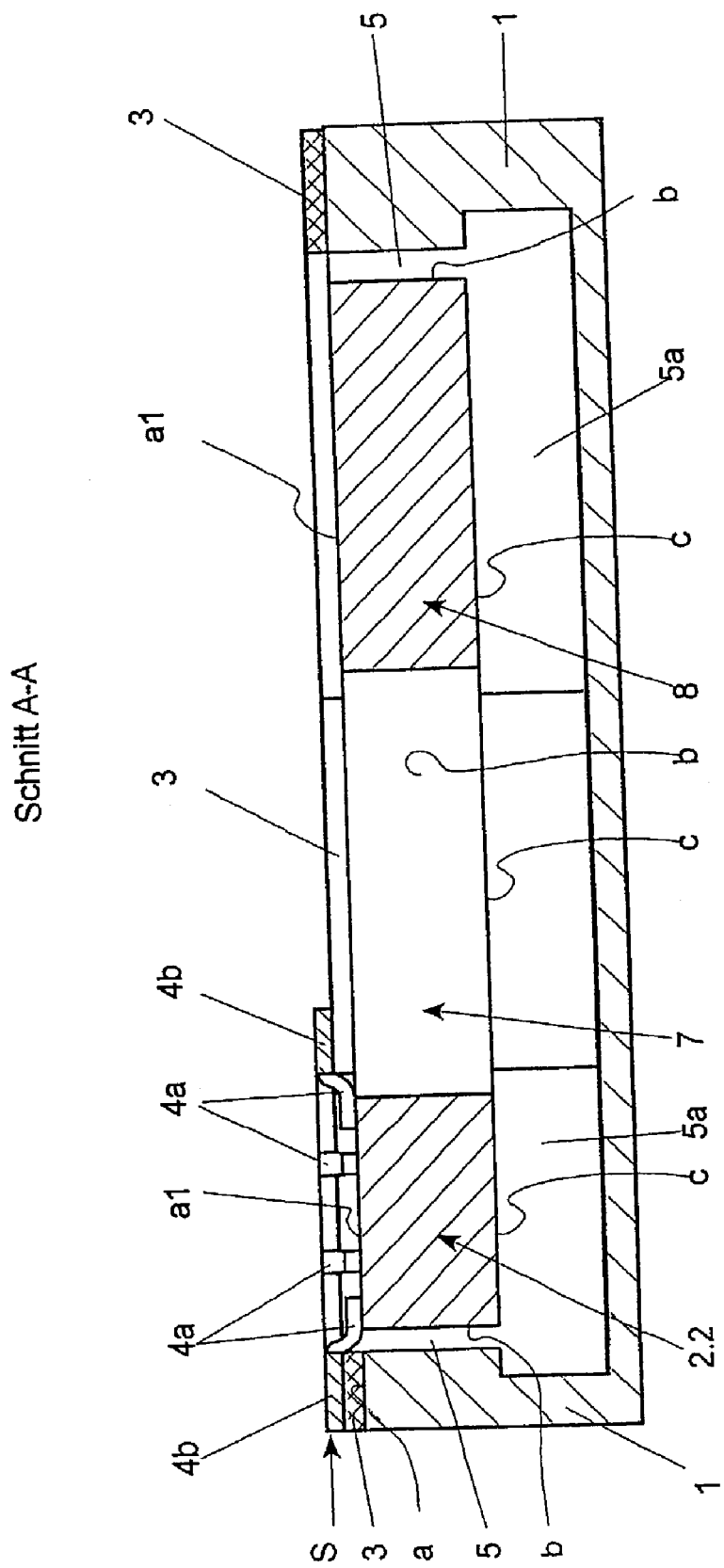

FIG. 2 shows substrate 1 with the already patterned electrically conductive layer S, FIG. 3 shows substrate 1 with an adhesive resist mask 6 for forming the functional unit, FIG. 4 shows substrate 1, vertical wells having been etched out, FIG. 5 shows substrate 1, the silicon having been removed from under the contact fingers 4a, FIG. 6 shows a microstructure with a functional unit 2.1 detached from the substrate by undercutting, FIG. 7 shows a microstructure with a functional unit in the form of a fastening anchor 2.2 as well as with a mass part 8 fastened thereon by way of a spring part 7, FIG. 8 is a sectional view taken along line A—A of FIG. 7.

The FIGS. 1 through 6 illustrate the various steps for fabricating a microstructure with a functional unit configured to form a silicon wafer in a substrate 1. Substrate 1 has for example a specific electrical resistance of 0.1 Ωcm and a diameter of 150 mm and is at first provided over its entire surface a with an isolation layer 3 consisting of silicon dioxide $SiO_2$ of 300 nm thick by means of thermal oxidation. As shown in FIG. 1, said isolation layer 3 is removed from that region of substrate 1 which is assigned to the functional unit 2.1. This is advantageously achieved by means of photolithography in connection with a prior art plasma etching process and a prior art plasma resist removal technique. In the subsequent steps, an electrically conductive layer S, in the form of an aluminium layer for example, is first deposited by means of a conventional sputtering technique, the thickness of said layer amounting to 800 nm. Said electrically conductive layer S is in turn provided, by means of photolithography, with an adhesive resist mask (not shown) that is placed into a defined position relative to the pattern provided in the isolation layer 3. The pattern in the electrically conductive layer S obtained by reactive ion etching using the mask forms a first structure 4a that is connected to the surface of the future functional unit 2.1, a second structure 4b that follows the contour of the first lateral isolation gap 5 later to surround the functional unit 2.1 and a conductive pattern 4c for future contact. The first structure 4a of the electrically conductive layer S is thereby configured to form contact fingers 4a, each of them having a structure width of e.g., 800 nm and partly resting lengthwise on the surface a not provided with an isolation layer of that region of substrate 1 which will later form the functional unit, as illustrated in FIG. 2. This step is again followed by usual plasma resist removal.

In the subsequent step according to FIG. 3, a further adhesive resist mask 6 is applied by means of photolithography, said mask defining, together with the electrically conductive layer S acting as a mask, the shape of all of the structures to be etched into the substrate 1. To realize the microstructure according to FIG. 7, these for example also include the spring part 7, the mass part 8 and the fastening anchor 2.2 as well. The position of said adhesive resist mask 6 is to be aligned with the position of the first structure 4a (shown here in the form of contact fingers 4a) in such a manner that the ends thereof are all equally covered with photoresist over a length of about 2 μm.

The now following silicon etching to a depth of about 20 μm is shown in FIG. 4 and is carried out preferably using a fluorine-based, alternating etching and coating process for reasons of selectivity. This known etching process makes an almost vertical etching profile possible. The future first lateral isolation gaps 5 (see FIG. 5) and a perforation P in the functional unit are substantially produced. Silicon substrate remains under the contact fingers 4a and is removed in a defined manner by means of subsequent isotropic etching (FIG. 5) so that the lateral isolation gaps 5 are now completely formed. As already explained, in this exemplary embodiment, this isotropic removal of at least 0.4 μm on each structure edge also causes the width of all of the microstructures to be reduced.

In order to obtain defined ultimate measurements for the microstructures, this subsequent removal has to be taken into consideration during the conception thereof already.

In a special exemplary embodiment, the isotropic and anisotropic etching may be performed in one step. It is known for example, that a defined lateral removal is adjustable when fluorine-based silicon etching is performed. In a particularly advantageous exemplary embodiment, said lateral removal is particularly high under those regions that are not masked with photoresist, under the contact fingers 4a for example. Then, the lateral removal can be taken into consideration to a lesser extent during conception, or it may not be taken into consideration at all. In this case again, the photoresist is removed after the etching processes have been carried out. Now, the functional unit is exposed in the known way by depositing a $SiO_2$ layer of 750 nm thick that acts as a passivation layer and is not illustrated in the drawing herein by plasma CVD, an anisotropic $SiO_2$ etching intended to open the $SiO_2$ layer at the bottom of the first lateral isolation gap 5 and the perforation P, and an isotropic silicon etching on the basis of a fluorine-based etching process. It has to be noted that in the exemplary embodiment described herein, a high aspect ratio of the openings is assumed. Meaning, the etching depth is approximately 10 times the width of the openings. The advantage thereof is that the $SiO_2$ layer at the bottom of the first isolation gap 5 and of the perforation P is only about one and a half times as thick as at the surface a of the structure. As a result thereof, after anisotropic $SiO_2$ etching for the purpose of removing the $SiO_2$ layer, said $SiO_2$ layer is opened at the bottom of the first lateral isolation gap 5 and of perforation P, whereas the surface a of the structures remains covered by a residual passivation layer 6. After exposure, and as a result thereof, after production of the second isolation gap 5a (see FIG. 6) under the base c of the functional unit (2.1), the residual oxide is removed from at least the surface of the microstructure by a maskless etching process.

FIG. 6 shows a partial sectional view of the produced microstructure provided with a functional unit 2.1 fixated to the substrate 1 by way of the contact fingers 4a. Functional unit 2.1 is provided with a surrounding first lateral isolation gap 5 located between the side areas b thereof and the substrate 1 and with a second isolation gap 5a located between the bottom c thereof and the substrate 1, thus being completely separated from the substrate 1. In functional unit 2.1 there is further a perforation P that was needed for undercutting. The contact fingers 4a of the electrically conductive layer S are connected to the upper side 1a of functional unit 2.1, span the first lateral isolation gap 5 and end in the second structure 4b of the electrically conductive layer S disposed on the isolation layer 3 and surrounding the first lateral isolation gap 5. A conductive pattern 4c, which serves for contacting, borders on the second structure 4b of the electrically conductive layer S. An electrode may be configured directly on the functional unit 2.1.

The microstructure in accordance with the invention surprisingly shows a very high mechanical stability as well as the expected high planarity together with very advantageous electrical properties. Isolation resistances in excess of $10^9$ Ohm were measured for the microstructures of the invention and the detectable parasitic capacitance relative to the substrate of about 5 pF was substantially due to the capacitance between the bonding areas and the silicon substrate.

FIG. 7 is a three-dimensional view and FIG. 8 the corresponding longitudinal sectional view A—A of a microstructure with a functional unit 2.1 in the form of a fastening anchor 2.2 with a mass part 8 fastened thereon by way of a spring part 7.

Fastening anchor 2.2, spring part 7 and mass part 8 were released from the substrate so that they all are spaced from the substrate 1 on all sides. A first surrounding lateral isolation gap 5 is disposed between substrate 1 and the side walls b of fastening anchor 2.2, spring part 7 and mass part 8 and a second isolation gap 5a is disposed between substrate 1 and the bases c of fastening anchor 2.2, spring part 7 and mass part 8. An isolation layer 3 is located on the surface a of substrate 1 and on that in turn there is located a patterned electrically conductive layer S. The first structure of the electrically conductive layer S is configured to form contact fingers 4a and is connected to the upper side 1a of the fastening anchor 2.2 consisting of substrate material so that said fastening anchor 2.2 is secured into position. The contact fingers 4a extend beyond isolation gap 5 until reaching a second structure 4b of the electrically conductive layer S that surrounds the fastening anchor 2.2. The electrically conductive layer S is further provided with a conductive pattern 4c for contact. To ensure undercutting over the entire area for the purpose of forming the second isolation gap 5a, fastening anchor 2.1 and mass part 8 are provided with a perforation P.

Depending on the case of application and as already described herein above, it is also possible to rigidly and directly mount the electrode onto the functional unit 2.1 instead of using an electrode in the form of mass part 8 which is movable by way of a spring part 7.

Likewise, the spring part 7 may also form the mass part 8.

In accordance with exemplary embodiments that are not illustrated herein, several mass parts 8 of similar or different configuration may be mounted on the fastening anchor 2.2 by way of spring parts 7.

What is claimed is:

1. A method of producing a microstructure comprising the steps of:
    (a) completely mechanically and electrically separating from a substrate on all sides by means of isolation gaps at least one functional unit comprising a fastening anchor, at least one spring part bordering on the fastening anchor, and at least one mass part connected to the spring part; and
    (b) depositing an electrically conductive layer so as to connect the fastening anchor via a first structure comprising a plurality of contact fingers formed in the electrically conductive layer to the electrically conductive layer, the contact fingers overlapping the isolation gaps as a bridge to secure the fastening anchor into position.

2. The method of claim 1, wherein the following method steps are performed:
    producing on the surface of the substrate an isolation layer with openings by patterning those regions which define the fastening anchor and the future surrounding first lateral isolation gaps between the substrate and the fastening anchor,
    depositing the electrically conductive layer onto the isolation layer and onto that region, which is not provided with an isolation layer and will form the fastening anchor and, concurrently or subsequently,
    patterning the electrically conductive layer in such a manner that at one site at least, a first structure of the electrically conductive layer remains connected to the fastening anchor to be produced, said connection extending through the future first lateral isolation gap between substrate and functional unit, and configuring a second structure of the electrically conductive layer that is connected to the first structure and, if necessary, a conductive pattern of the electrically conductive layer on the substrate provided with the isolation layer,
    completely electrically and mechanically separating the fastening anchor from the substrate by a sequence of etching processes in connection with at least one passivation step so as to form the isolation gaps, the connection to the fastening anchor created by the first structure of the electrically conductive layer being maintained at one site at least in the way of a bridge so that the fastening anchor is secured into position as a result thereof.

3. The method according to claim 1, wherein, to completely electrically and mechanically separate fastening anchor and/or spring part and/or mass part from the substrate except for the mechanical fixation of the functional unit or of the fastening anchor through the first structure of the electrically conductive layer, the following processes are carried out:
    etching wells into the substrate for the purpose of forming the first lateral isolation gaps using a photolithographically manufactured mask concurrently with the mask produced through the masking effect of the patterned surface layers,
    depositing a passivation layer on vertical and horizontal areas of the first lateral isolation gaps,
    etching the passivation layer for the purpose of removing it from at least the bottom of the first lateral isolation gaps, undercutting the substrate material under the regions of the to be produced functional unit or fastening anchor and, if required, of the spring part and/or the mass part that are protected both on the side areas and on the surface thereof in order to produce the second isolation gap between substrate and base of functional unit or fastening anchor and/or spring part and/or mass part.

4. The method according to claim 2, wherein the isolation layer is produced by thermal oxidation of silicon or by chemical vapour phase deposition.

5. The method according to claim 1, wherein, to create the a first lateral isolation gap, wells are etched into the substrate normal to the substrate surface by means of reactive ion etching processes.

6. The method according to claim 5, wherein, simultaneously with or after etching of the wells into the substrate, a defined isotropic etching of the substrate material is performed by means of reactive ion etching processes in the substrate to completely electrically isolate the substrate from the electrically conductive layer.

7. The method according to claim 1, wherein, to etch at least one first lateral isolation gap into the substrate, gases containing fluorine and carbon are utilized.

8. The method according to claim 1, wherein, to etch a plurality of isolation gaps into the substrate, gases containing chlorine or fluorine are utilized.

9. The method according to claim 1, further comprising using dry etching processes, wet chemical etch solutions, or a combination of dry etching processes and wet chemical etch solutions for defined isotropic etching.

10. The method according to claim 1, wherein, after undercutting material from the substrate, a passivation layer is completely removed from a surface of the electrically conductive layer.

11. The method according to claim 10, wherein the passivation layer comprises an organic material which, after isotropic etching, is completely removed from the surface of the electrically conductive layer by means of a dry etching process.

12. The method according to claim 10, wherein the passivation layer comprises a plasma polymer.

13. The method according to claim 1, wherein the electrically conductive layer is subsequently placed in electric contact through peripheral connections.

14. The method according to claim 1, wherein the electrically conductive layer is placed in electric contact through peripheral connections that are already provided in the surrounding substrate.

15. The method according to claim 1, wherein, after the electrically conductive layer has been applied and patterned, an additional second passivation layer is deposited which is patterned subsequently, immediately prior to etching wells into the substrate with the same mask as used for etching the first lateral isolation gaps into the substrate.

16. The method according to claim 10, wherein the additional second passivation layer is removed from at least the surface of the electrically conductive layer together with the passivation layer.

* * * * *

UNITED STATES PATENT AND TRADEMARK OFFICE
CERTIFICATE OF CORRECTION

PATENT NO. : 6,969,628 B2  Page 1 of 1
APPLICATION NO. : 10/296771
DATED : November 29, 2005
INVENTOR(S) : Bertz et al.

It is certified that error appears in the above-identified patent and that said Letters Patent is hereby corrected as shown below:

Column 10, line 43, (Line 1 of Claim 5), after the word "create", please delete: --the--.

Signed and Sealed this

First Day of August, 2006

JON W. DUDAS
*Director of the United States Patent and Trademark Office*